Sept. 25, 1956 L. E. BARTON 2,764,674

TRANSISTOR RECEIVER OSCILLATOR INJECTION USING
CAPACITANCE BETWEEN STATORS OF GANG CAPACITOR

Filed March 17, 1955

INVENTOR.
Loy E. Barton
BY
[signature]
ATTORNEY.

United States Patent Office 2,764,674 Patented Sept. 25, 1956

2,764,674

TRANSISTOR RECEIVER OSCILLATOR INJECTION USING CAPACITANCE BETWEEN STATORS OF GANG CAPACITOR

Loy E. Barton, Princeton, N. J., assignor to Radio Corporation of America, a corporation of Delaware Application March 17, 1955, Serial No. 494,972

The terminal fifteen years of the term of the patent to be granted has been disclaimed 6 Claims. (Cl. 250—20)

This invention relates in general to signal receiving systems and the like, and in particular to radio frequency and oscillator tuning means and oscillator injection circuits for signal mixing in receivers, frequency converters and the like.

In signal receiving systems generally, the received signal is combined or mixed with a local oscillator signal, being thereby converted into a new signal with the same modulation but at a lower or intermediate carrier frequency. This intermediate frequency signal is then amplified and detected to reproduce the original modulation components.

The local oscillator circuit and the input radio frequency circuit of signal receiving systems of the type referred to are usually tuned simultaneously by means of variable capacitors. The most common type of variable capacitor which is used for this application consists of a series of spaced conductive plates arranged in groups called stators and rotors. The rotors or rotor plates are generally mounted on and movable with a rotatable conductive shaft and interleave with the stators or stator plates which are fixed in position and insulated from the rotor plates. The radio frequency and oscillator tuning capacitors are generally ganged or arranged with their shafts connected to be operated by a single tuning dial. Both the local oscillator and radio frequency circuits of the receiver are thereby tuned simultaneously.

The local oscillator circuit is coupled or connected to the input circuit of the signal mixing device. In this way, the oscillator signal is injected into the mixer to combine with the input signal to produce the beat or intermediate frequency signal. Constant frequency difference may be maintained between the oscillator and radio frequency circuits through the use in the oscillator circuit of a combination of fixed shunt and series connected capacitors together with a gang capacitor in which all the sections are identical, or by the use of a gang capacitor in which specially shaped plates are used in the oscillator section.

Irrespective of whether tubes or transistors are used in signal receiving systems of the type referred to, the circuit arrangement including the use of a gang capacitor in general has been the same and subject to certain disadvantages in construction and operation.

It is accordingly a principal object of the present invention to provide an improved radio frequency and oscillator tuning arrangement and oscillator injection circuit for signal receiving systems and the like which is simple in construction and reliable in operation, and adapted for use with transistors and like semi-conductor devices as the active signal translating elements.

It is another object of the present invention to provide an improved radio frequency and oscillator tuning circuit including a variable gang capacitor which operates more readily through simplified coupling means to provide constant injection of the local oscillator signal to the signal mixer of signal receiving systems of the type employing transistors as active signal amplifying and translating elements.

It is a further object of the present invention to provide an improved radio frequency and oscillator tuning arrangement and oscillator injection circuit for signal receiving systems and the like, wherein accurate tracking between the local oscillator and radio frequency circuits of the circuits and stable and efficient circuit operation are obtained.

It is yet another object of the present invention to provide an improved radio frequency and oscillator tuning circuit including a variable gang capacitor for radio signal receiving systems of the type employing transistors as active signal amplifying and translating elements wherein injection of the local oscillator signal to the signal mixer is accomplished without conductive connection means between the oscillator circuit and the signal mixer circuit.

These and further objects and advantages of the present invention are achieved in accordance with the invention by a gang variable tuning capacitor of the moving plate type in which, in contrast to the normal practice, the stator plates exceed the rotor plates in number. The stators and rotors are arranged so that the inside stator plates of the oscillator and radio frequency capacitors are in relatively close spaced capacity coupling relation to each other. It has been found, in accordance with the invention, that by such an arrangement the existing capacity between the inside or spaced stator plates of two variable capacitors may be made sufficient to constitute the coupling capacity between the oscillator and the input circuit of, for example, a signal receiver employing transistors. An additional rotor plate is added, in accordance with the invention, as a shield between the inside stator plates and is used to vary the capacitive coupling therebetween thereby to provide constant injection of the oscillator signal.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
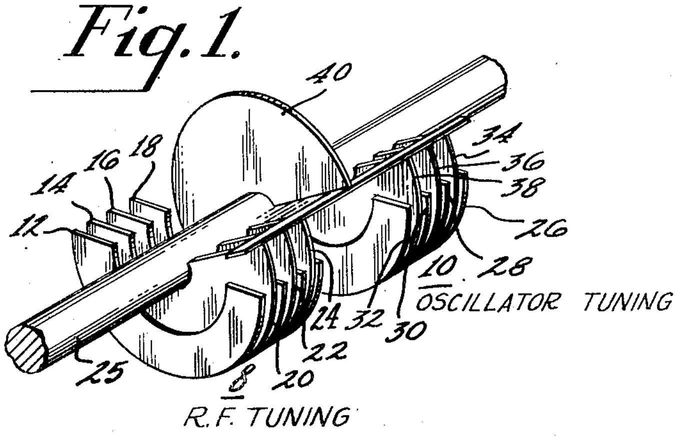
Figure 1 is a simplified view, in perspective, of a variable gang tuning capacitor for operation in a system in accordance with the invention.
Figures 2, 3, 4:
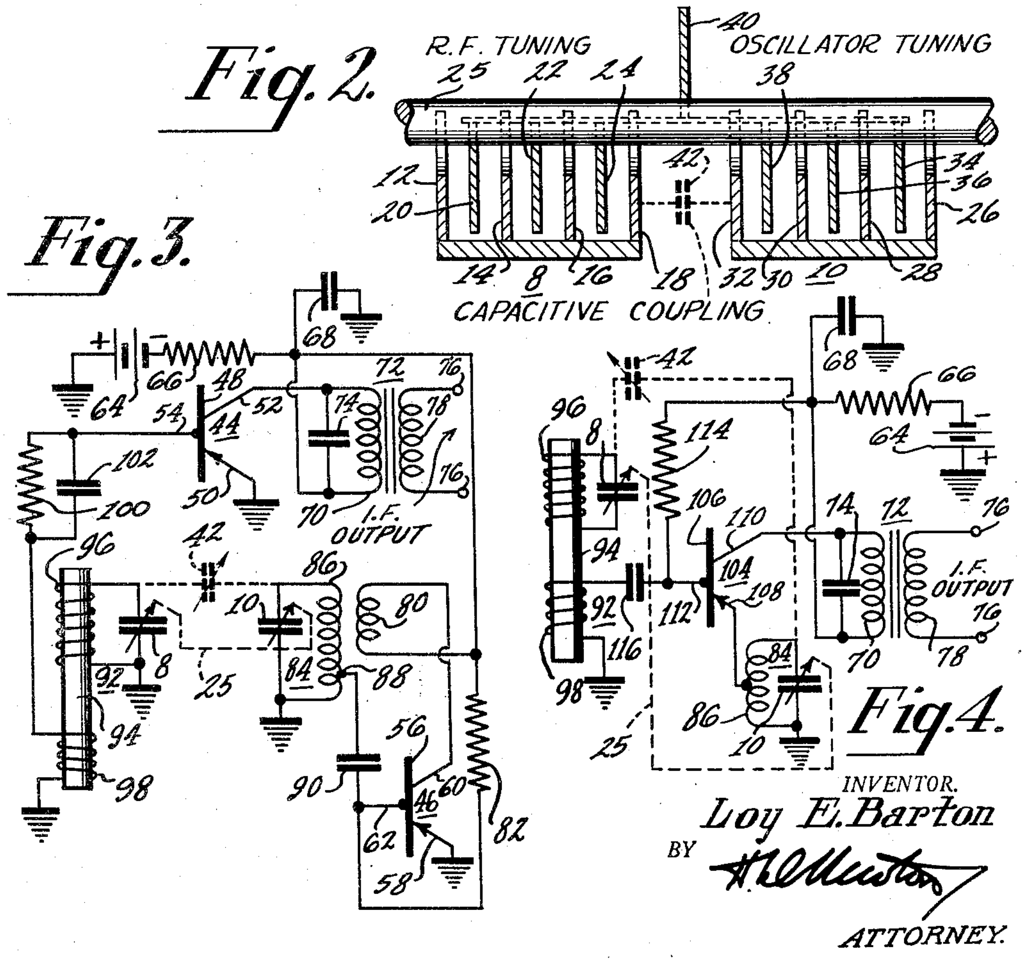
Figure 2 is a side view, partially in section, of the variable gang tuning capacitor illustrated in Figure 1.
Figures 3 and 4 are schematic circuit diagrams of the radio frequency and oscillator circuits of transistor signal receiving systems provided with a tuning capacitor of the type illustrated in Figures 1 and 2, in accordance with the invention.

Referring now to the drawing, wherein like parts are indicated by like reference numerals throughout the figures, and referring in particular to Figures 1 and 2, a variable gang tuning capacitor in accordance with the invention comprises a radio frequency tuning capacitor 8 and a local oscillator tuning capacitor 10. The radio frequency tuning capacitor 8 comprises four stator plates 12, 14, 16 and 18, which are mounted as is conventional in a fixed position, and three rotor plates 20, 22 and 24, which are mounted on a rotatable shaft 25 and are spaced so as to travel within the stators. Similarly, the oscillator tuning capacitor 10 comprises four stator plates 26, 28, 30 and 32 and three rotor plates 34, 36 and 38. It should be understood that the stators and rotors of both the radio frequency and oscillator tuning capacitors may vary in number of plates depending upon the particular circuit application and the tuning needs of the circuit. In general, however, the number of stator plates for each tuning capacitor will exceed the number of rotor plates by one and the two inside stator plates of each section will be mounted as shown in Figures 1 and 2 so that they are adjacent and exposed to each other. Thus, as shown in the drawing by way of example, the inside stator plate 18 of the radio frequency capacitor is mounted adjacent to the inside stator plate 32 of the oscillator tuning capacitor, so that in the position shown in Figure 2 with the rotors in their downward vertical-most position, the surfaces of the stator plates 18 and 32 are fully exposed to each other. It should be further understood that while the stators and rotors have been chosen to be of uniform plate shape and size, they could be any size or shaped as desired in accordance with the particular circuit application.

A shield member 40 is also mounted on the shaft 45 and is rotated thereby as indicated. The shield 40 is mounted parallel to the rotors but on the side of the shaft 25 opposite the side upon which the rotors are mounted, that is, substantially 180° in angular spacing therefrom. Accordingly, when the shaft is rotated so the shield 40 is interleaved between the two inside stator plates 32 and 18, the rotors will not be interleaved between the stators but will be clear thereof. When the rotors are interleaved between the stators, however, the shield 40 will be removed completely from between the stators 18 and 32 as shown, for example, in Figure 2. In an intermediate position, as in Figure 1, the shield 40 will be interposed between and shield a portion of the stators 18 and 32 from each other.

As shown in Figure 2, a capacitance exists between the two inner stator plates 18 and 32 of the radio frequency and oscillator tuning capacitors respectively. This capacitance, which has been illustrated in dotted lines as a capacitor 42, is used, in accordance with the invention, to provide injection of the generated local oscillator signal to the mixer of the receiver as will be seen more clearly in Figures 3 and 4. The position of the shield 40 should be chosen in general so as to decrease the capacitive coupling at higher frequencies. For lower frequency operation, however, the position of the shield 40 is chosen so that it does not appreciably affect the capacitive coupling between the stators 18 and 32.

In Figure 3, a portion of a radio signal receiver includes a pair of transistors 44 and 46, which are used as a signal mixer and the active signal translating element of the local oscillator circuit, respectively. Each of the transistors 44 and 46 may be considered to be of the P–N–P junction type and include a semi-conductive body with which three electrodes are cooperatively associated in a well-known manner. Thus, the transistor 44 includes a semi-conductive body 48 and an emitter 50, a collector 52 and a base 54. In the same manner, the transistor 46 of the oscillator circuit includes a semi-conductive body 56, an emitter 58, a collector 60 and a base 62. It should be understood that transistors of opposite conductivity types, that is of P type conductivity, or different type transistors, such as point-contact transistors, may be used. If transistors of P type conductivity are used, however, the polarity of the biasing voltages is reversed.

The emitters 50 and 58 of the transistors 44 and 46 respectively are both connected directly to a point of reference potential or ground for the system as shown. To provide the necessary biasing potentials for proper operation of the transistors 44 and 46, a battery 64 is provided, the positive terminal of which is grounded and the negative terminal of which is connected through a suitable filter comprising a series resistor 66 and a capacitor 68, which is connected from one end of the resistor 66 to ground and through the primary winding 70 of the output coupling transformer 72 for the transistor 44 to the collector 52 of this transistor. A capacitor 74 is connected in parallel with the primary winding 70 to form a tuned circuit which will normally be tuned to the beat or intermediate frequency of the receiver. The intermediate frequency signal is taken from a pair of output terminals 76, which are connected to either end of the secondary winding 78 of the output transformer 72.

The negative terminal of the battery 64 is also connected through the filter comprising the resistor 66 and the capacitor 68 and through a feedback winding 80 of the oscillator circuit to the collector 60 of the transistor 46 and through a resistor 82 to the base 62 of the transistor 46. A parallel resonant tuned circuit 84, comprising an inductor 86 and the oscillator tuning capacitor 10 of the same general type illustrated in Figures 1 and 2, is provided for the oscillator circuit. A tap 88 on the inductor 86 is connected through a coupling capacitor 90 to the base 62 of the transistor 46. The feedback inductor 80 is inductively coupled with the inductor 86 of the oscillator tuned circuit 84. Feedback is thus between the base and the collector of the transistor 46 and of proper phase and magnitude to sustain continuous oscillation of the oscillator circuit.

A radio frequency input circuit for the receiver includes an antenna 92 comprising, for example, a ferrite rod 94 having a pair of inductive windings 96 and 98. The radio frequency tuning capacitor 8 is connected in parallel with the winding 96 and tunes it to the incoming or radio frequency signal. The received signal is then coupled through the antenna coupling winding 98 and a series resistor 100 to the base 54 of the transistor mixer 44. A capacitor 102 is connected in shunt with the resistor 100.

As explained in connection with Figures 1 and 2, the capacity which exists between the inside stator plates 18 and 32 of the radio frequency and oscillator tuning capacitors 8 and 10 respectively is used, in accordance with the invention, as the coupling means for injecting the generated oscillator signal to the signal mixer of the receiver. As shown in Figure 3, the capacity between the stators of a variable gang tuning capacitor of the type illustrated in Figures 1 and 2 has been illustrated in dotted lines by the capacitor 42, which is connected between the oscillator tuned circuit 84 and the radio frequency input circuit comprising the antenna winding 96 and the radio frequency tuning capacitor 8.

In operation, the local oscillator signal generated by the oscillator circuit which includes the transistor 46, is coupled through the capacitor 42, which represents the capacity between the inside stators, to the radio frequency input circuit. Accordingly, the received radio frequency signal and the local oscillator signal are coupled through the coupling winding 98 of the antenna 92 and the series resistor 100 to the base 54 of the transistor mixer 44. The oscillator signal and the received radio frequency signal are, accordingly, mixed to produce a beat or intermediate frequency signal which appears at the output terminals 76.

The shield 40, as was explained hereinbefore, is arranged on the rotatable shaft 25 so that at higher frequencies it is interleaved between the two inside or adjacent stator plates 18 and 32. Accordingly, as the receiver is tuned by rotating the shaft 25, the capacitive coupling between the stators 18 and 32 is varied as the shield 40 is rotated. Since this capacitive coupling without the shield 40 is maximum at high frequencies and minimum at low frequencies, the shield 40 serves to maintain the amplitude of the injected oscillator voltage substantially constant.

As described, it is evident that by provision of the invention, coupling of the generated local oscillator signal to the signal mixer stage of a radio receiver is accomplished without providing a conductive connection from the oscillator to the mixer. Moreover, this coupling is accomplished while maintaining the amplitude of the injected oscillator voltage substantially constant over the required tuning range. It has been found, furthermore, that the tuning of the local oscillator and radio frequency stages is obtained with a relatively small tracking error over the tunable frequency range. The circuit operation thus obtained is stable and efficient and a good signal-tonoise ratio has been observed. Thus, by utilizing a variable gang tuning capacitor in which injection of the local oscillator signal to the mixer is provided through capacitive coupling in the tuning capacitor, relatively simple circuit connections are possible with improved circuit performance.

In Figure 4, a single transistor 104, which includes a semi-conductive body 106 and an emitter 108, a collector 110 and a base 112 is used as both the active element of the oscillator circuit and as a signal mixer. To this end, the parallel resonant or oscillator tuned circuit 84 is connected between the emitter 108 and ground and the coupling winding 98 of the antenna 92 is connected through a coupling capacitor 116 to the base 112 of the transistor 104. The emitter 108 may be connected as shown to an intermediate point on the inductor 86 or to the top of the tuned circuit 84. Correct biasing of the transistor 104 is obtained by connecting the negative terminal of the battery 64 through the series resistor 66 and the primary winding 70 of the output transformer 72 to the collector 110 of the transistor 104 and through the resistor 114 to the base 112 of the transistor 104.

In Figure 4, as in Figure 3, it should be understood that the radio frequency tuning capacitor 8 and the local oscillator tuning capacitor 10 are of the variable plate type which are ganged for unitary operation. The capacitors 8 and 10 will, accordingly, be of the same general type as the variable gang tuning capacitor illustrated in Figures 1 and 2. Accordingly, the capacity which exists between the inside stator plates 18 and 32 is used to provide the necessary conductive coupling for injection of the oscillator signal. In Figure 4, this capacity has been illustrated by the dotted line connection including the capacitor 42 between the oscillator tuned circuit 84 and the radio frequency tuning circuit comprising the antenna winding 96 and the radio frequency tuning capacitor 8.

In the embodiment of the invention illustrated in Figure 4, the capacity between the stator plates 18 and 32 is used as a feedback means between the emitter circuit and the base 112 of the transistor 104 and, in addition, as the coupling means for injecting the developed oscillator signal through the input circuit to the base 112 for mixing with the received signal. Thus, in operation, by means of this capacitive coupling, feedback of the oscillator signal from the emitter to the base of the transistor 104 of proper phase and magnitude to sustain continuous oscillation is provided. In addition, the developed oscillator signal is coupled by means of this capacitive coupling through the radio frequency input circuit of the antenna 92, the coupling winding 92 of the antenna, and the capacitor 116 to the base 112. At the same time, the radio frequency signal which is received by the antenna 92 is coupled to the base 112. The oscillator and radio frequency signals are thus combined and the resultant beat or intermediate frequency signal may be taken from across the output terminals 76.

As described, the circuit illustrated in Figure 4 provides a method of converting the received signal to an intermediate frequency signal utilizing a single transistor. By utilizing a gang variable capacitor of the type illustrated in Figures 1 and 2 in the circuit arrangement shown in Figure 4, moreover, the same advantages noted for the circuit of Figure 3 are obtained. Thus the circuit of Figure 4 is simplified and more reliable in operation and provides substantially constant injection of the oscillator signal.

Injection of the generated local oscillator signal to the signal mixer of a signal receiver is accomplished, in accordance with the invention, without the necessity of providing a conductive connection between the oscillator and the mixer. While thus simplifying the circuit connections of the receiver, constant amplitude injection of the oscillator signal is provided and the tracking error is small.

What is claimed is:

1. In a radio receiver, the combination with a tunable radio frequency input circuit and a tunable local oscillator circuit, of a common variable tuning means for said circuits including a variable gang tuning capacitor comprising a first set of rotor plates spaced along a common axis of rotation, a first set of stator plates supported in parallel relation and arranged with respect to said first set of rotor plates and connected with said input circuit to produce a variable capacity in response to the rotation of said rotor plates for tuning said input circuit, a second set of rotor plates spaced along said common axis of rotation, a second set of stator plates supported in parallel relation and arranged with respect to said second set of rotor plates and connected with said oscillator circuit to produce a variable capacity in response to the rotation of said rotor plates for tuning said oscillator circuit, said first set of stator plates including one stator plate located near and on one side of the center point of said common axis and adjacent to a stator plate of said second set which is located near and on the other side of the center point of said common axis to provide capacitive coupling therebetween for injecting a generated oscillator signal from said oscillator circuit to said radio frequency input circuit, and shielding means supported at substantially the center of said common axis and having angular spacing with respect to the direction of rotation of said rotor plates whereby the capacitive coupling between said stator plates is varied.

2. In a radio signal receiver, the combination with a transistor including an emitter, a base and a collector electrode, a tunable radio frequency input circuit coupled with said base electrode, a tunable frequency determining oscillator circuit connected with said emitter electrode, and a signal output circuit connected with said collector electrode, of a variable gang tuning capacitor comprising a first set of rotor plates spaced along a common axis of rotation, a first set of stator plates arranged with respect to said first set of rotor plates and connected with said input circuit to produce a variable capacity in response to the rotation of said rotor plates for tuning said input circuit, a second set of rotor plates spaced along said common axis of rotation, a second set of stator plates arranged with respect to said second set of rotor plates and connected with said frequency determining circuit to produce a variable capacity in response to the rotation of said rotor plates for tuning said frequency determining circuit, said first set of stator plates including one stator plate adjacent and in proximity to a stator plate of said second set to provide capacitive coupling therebetween for injecting a generated oscillator signal to said radio frequency input circuit and to provide regenerative feedback from said emitter to said base electrode, and means responsive to the rotation of the rotor plates for varying said last named coupling.

3. In a radio receiver, the combination with a tunable radio frequency input circuit, a tunable local oscillator circuit including a first transistor, a signal mixing stage including a second transistor, and means coupling said input circuit with said second transistor, of a common variable tuning means for said circuits including a variable gang tuning capacitor comprising a first set of rotor plates spaced along a common axis of rotation, a first set of stator plates arranged with respect to said first set of rotor plates and connected with said input circuit to produce a variable capacity in response to the rotation of said rotor plates for tuning said input circuit, a second set of rotor plates spaced along said common axis of rotation, a second set of stator plates arranged with respect to said second set of rotor plates and connected with said oscillator circuit to produce a variable capacity in response to the rotation of said rotor plates for tuning said oscillator circuit, said first set of stator plates including one stator plate located adjacent to a stator plate of said second set to provide capacitive coupling therebetween for injecting a generated oscillator signal from said oscillator circuit to said radio frequency input circuit whereby a received signal is mixed with said oscillator signal by said second transistor to provide an intermediate frequency signal.

4. In a radio receiver, the combination with a tunable input circuit and a tunable oscillator circuit, of a variable tuning means for said circuits including a variable gang tuning capacitor comprising a first set of rotor plates spaced along a common axis of rotation, a first set of stator plates arranged with respect to said first set of rotor plates and connected with said input circuit to produce a variable capacity for tuning said input circuit, a second set of rotor plates spaced along said common axis of rotation, a second set of stator plates arranged with respect to said second set of rotor plates and connected with said oscillator circuit to produce a variable capacity for tuning said oscillator circuit, said first set of stator plates including one stator plate located near and on one side of the center of said common axis, said second set of stator plates including a further stator plate located near and on the other side of the center of said common axis and adjacent to said one stator plate of said first set to provide capacitive coupling therebetween for injecting a generated oscillator signal from said oscillator circuit to said input circuit, and shielding means for varying said capacitive coupling in response to the rotation of said rotor plates.

5. In a radio signal receiver, the combination with a tunable radio frequency input circuit, a first transistor having emitter, collector and base electrodes, a tunable frequency determining oscillator circuit connected with the emitter electrode of said first transistor, a second transistor having emitter, collector and base electrodes, and means coupling said input circuit with the base electrode of said second transistor for applying a received signal thereto, of a variable gang tuning capacitor comprising a first set of rotor plates spaced along a common axis of rotation, a first set of stator plates arranged with respect to said first set of rotor plates and connected with said input circuit to produce a variable capacity in response to the rotation of said rotor plates for tuning said input circuit, a second set of rotor plates spaced along said common axis of rotation, a second set of stator plates arranged with respect to said second set of rotor plates and connected with said frequency determining circuit to produce a variable capacity in response to the rotation of said rotor plates for tuning said frequency determining circuit, said first set of stator plates including one stator plate adjacent and in proximity to a stator plate of said second set to provide capacitive coupling therebetween for injecting a generated oscillator signal to said radio frequency input circuit whereby said oscillator signal and said radio frequency signal are mixed to provide an intermediate frequency signal, and means responsive to the rotation of the rotor plates for varying said last named coupling.

6. In a radio signal receiver having a tunable radio frequency input circuit and a tunable local oscillator circuit, the combination comprising, a semi-conductor signal amplifying device, signal conductive means coupling said input circuit with one of the electrodes of said device, means connecting said oscillator circuit with another electrode of said device, a variable gang tuning capacitor comprising a first set of rotor plates spaced along a common axis of rotation, a first set of stator plates arranged with respect to said first set of rotor plates and connected with said input circuit to produce a variable capacity in response to the rotation of said rotor plates for tuning said input circuit, a second set of rotor plates spaced along said common axis of rotation, and a second set of stator plates arranged with respect to said second set of rotor plates and connected with said oscillator circuit to produce a variable capacity in response to the rotation of said rotor plates for tuning said local oscillator circuit, said first set of stator plates including one stator plate adjacent and in proximity to a stator plate of said second set whereby the capacitor therebetween provides capacitive coupling to provide signal feedback for said oscillator circuit and for injecting a generated oscillator signal from said oscillator circuit to said radio frequency input circuit.

References Cited in the file of this patent

UNITED STATES PATENTS

| | | |
|---|---|---|
| 2,045,910 | Harnett | June 30, 1936 |
| 2,061,416 | Blume | Nov. 17, 1936 |
| 2,647,957 | Mallinckrodt | Aug. 4, 1953 |
| 2,653,228 | Pan | Sept. 22, 1953 |
| 2,700,730 | Prew | Jan. 25, 1955 |

FOREIGN PATENTS

| | | |
|---|---|---|
| 352,706 | Great Britain | July 16, 1931 |